US011069678B2

(12) United States Patent
Zampardi et al.

(10) Patent No.: US 11,069,678 B2
(45) Date of Patent: Jul. 20, 2021

(54) LOGIC GATE CELL STRUCTURE

(71) Applicant: Qorvo US, Inc., Greensboro, NC (US)

(72) Inventors: Peter J. Zampardi, Newbury Park, CA (US); Brian G. Moser, Jamestown, NC (US); Denny Limanto, Jamestown, NC (US)

(73) Assignee: Qorvo US, Inc., Greensboro, NC (US)

( * ) Notice: Subject to any disclaimer, the term of this patent is extended or adjusted under 35 U.S.C. 154(b) by 148 days.

(21) Appl. No.: 15/689,595

(22) Filed: Aug. 29, 2017

(65) Prior Publication Data
US 2019/0067275 A1 Feb. 28, 2019

(51) Int. Cl.
*H01L 27/02* (2006.01)
*H01L 27/07* (2006.01)
*H01L 29/06* (2006.01)
*H01L 29/778* (2006.01)
*H01L 29/732* (2006.01)
*H01L 29/08* (2006.01)
(Continued)

(52) U.S. Cl.
CPC ...... *H01L 27/0705* (2013.01); *H01L 21/8252* (2013.01); *H01L 27/0207* (2013.01); *H01L 27/0605* (2013.01); *H01L 27/0623* (2013.01); *H01L 29/0642* (2013.01); *H01L 29/0821* (2013.01); *H01L 29/0843* (2013.01); *H01L 29/1033* (2013.01); *H01L 29/1058* (2013.01); *H01L 29/41708* (2013.01); *H01L 29/6631* (2013.01); *H01L 29/732* (2013.01); *H01L 29/7786* (2013.01); *H01L 29/7787* (2013.01); H01L 29/0804 (2013.01); H01L 29/0891 (2013.01); H01L 29/1004 (2013.01); H01L 29/205 (2013.01); H01L 29/66318 (2013.01); H01L 29/7371 (2013.01); H01L 29/812 (2013.01)

(58) Field of Classification Search
CPC ............ H01L 27/0705; H01L 27/0207; H01L 29/0642; H01L 29/1058; H01L 29/205; H01L 29/732; H01L 29/7786
USPC ....................................................... 257/195
See application file for complete search history.

(56) References Cited

U.S. PATENT DOCUMENTS 3,609,479 A    9/1971  Lin et al.
4,912,976 A *  4/1990  Labriola, II .......... G01F 23/263
                                                       141/95
(Continued)

OTHER PUBLICATIONS

US 7,977,708 B1, 07/2011, Henderson et al. (withdrawn)
(Continued)

*Primary Examiner* — Ori Nadav
(74) *Attorney, Agent, or Firm* — Withrow & Terranova, P.L.L.C.

(57) ABSTRACT

A logic gate cell structure is disclosed. The logic gate cell structure includes a substrate, a channel layer disposed over the substrate, and a field-effect transistor (FET) contact layer disposed over the channel layer. The FET contact layer is divided by an isolation region into a single contact region and a combined contact region. The channel layer and the FET contact layer form part of a FET device. A collector layer is disposed within the combined contact region over the FET contact layer to provide a current path between the channel layer and the collector layer though the FET contact layer. The collector layer, a base layer, and an emitter layer form part of a bipolar junction transistor.

22 Claims, 5 Drawing Sheets

(51) Int. Cl.
*H01L 29/10* (2006.01)
*H01L 29/66* (2006.01)
*H01L 27/06* (2006.01)
*H01L 29/417* (2006.01)
*H01L 21/8252* (2006.01)
*H01L 29/205* (2006.01)
*H01L 29/812* (2006.01)
*H01L 29/737* (2006.01)

(56) References Cited

U.S. PATENT DOCUMENTS

| | | | | |
|---|---|---|---|---|
| 5,250,826 | A * | 10/1993 | Chang | H01L 29/7371 257/192 |
| 6,025,615 | A * | 2/2000 | Liu | H01L 29/0817 257/191 |
| 6,906,359 | B2 * | 6/2005 | Zampardi | H01L 27/0605 257/192 |
| 7,656,002 | B1 | 2/2010 | Barratt et al. | |
| 8,987,782 | B2 * | 3/2015 | Ichikawa | H01L 21/8252 257/183 |
| 9,019,028 | B2 * | 4/2015 | Lin | H01L 29/36 257/197 |
| 9,087,923 | B2 * | 7/2015 | Lin | H01L 27/0623 |
| 9,761,678 | B2 * | 9/2017 | Moser | H01L 29/41708 |
| 2006/0160316 | A1 * | 7/2006 | Casady | H01L 21/0445 438/311 |
| 2006/0237741 | A1 | 10/2006 | Takeuchi | H01L 33/0079 257/103 |
| 2008/0230806 | A1 * | 9/2008 | Pan | H01L 21/8252 257/195 |
| 2011/0169050 | A1 * | 7/2011 | Mishra | H01L 21/187 257/190 |
| 2011/0241076 | A1 * | 10/2011 | van den Oever | H01L 29/4236 257/197 |
| 2012/0154067 | A1 * | 6/2012 | Nakamura | H03B 5/1243 331/117 FE |
| 2014/0327083 | A1 * | 11/2014 | Park | H01L 27/0623 257/370 |
| 2015/0054036 | A1 * | 2/2015 | Yang | H01L 29/7786 257/195 |
| 2015/0056767 | A1 * | 2/2015 | Trivedi | H01L 27/0623 438/235 |

OTHER PUBLICATIONS

Ho, W.-J., et al., "Monolithic Integration of HEMTs and Schottky Diodes for Millimeter Wave Circuits," 10th Annual IEEE Gallium Arsenide Integrated Circuit (GaAs IC) Symposium, Nov. 6-9, 1988, pp. 301-304, Nashville, Tennessee, USA.

Itakura, K., et al., "A GaAs Bi-FET Technology for Large Scale Integration," 1989 IEEE International Electron Devices Meeting, Dec. 3-6, 1989, 4 pages, Washington, D.C., USA.

Kiziloglu, K, et al., "InP-based mixed device (HEMT/HBT) technology on planar substrate for high performance mixed-signal and optoelectronic circuits," Electronics Letters, vol. 33, No. 24, Nov. 20, 1997, pp. 2065-2066.

Tsai, J.-H., "Integrated fabrication of InGaP/GaAs &-doped Heterojunction bipolar transistor and doped-channel field effect transistor," IEEE 2002 Conference on Optoelectronic and Microelectronic Materials and Devices, Dec. 11-13, 2002, pp. 365-368, Sydney, Australia.

Tu, M.C., et al., "Performance optimizing on multi-function MMIC design," Microelectronic Engineering, vol. 86, Feb. 25, 2008, pp. 2114-2118.

Vora, M.B., et al., "BIFET—a high-performance, bipolar-MOSFET(NPN-nMOS) structure," 1972 IEEE International Electron Devices Meeting, Dec. 4-6, 1972, 1 page, Washington, D.C., USA.

Wang, K.-C., et al., "Diode-HBT-Logic Circuits Monolithically Integrable with ECL/CML Circuits," IEEE Journal of Solid-State Circuits, vol. 27, No. 10, Oct. 1992, pp. 1372-1378.

Yang, J.Y., et al., "GaAs BIJFET Technology for Linear Circuits," 11th Annual IEEE Gallium Arsenide Integrated Circuit (GaAs IC) Symposium, Oct. 22-29, 1989, pp. 341-344, San Diego, California, USA.

Yang, Y.F., et al., "Integration of GaInP/GaAs Heterojunction Bipolar Transistors and High Electron Mobility Transistors," IEEE Electron Device Letters, vol. 17, No. 7, Jul. 1996, pp. 363-365.

Zampardi, P.J., et al., "High-Volume Manufacturing Considerations for III-V Merged HBT-FET (BiFET) Technologies," Extended abstract of a paper presented at CS-MAX, Oct. 30-Nov. 2, 2005, pp. 32-34, Palm Springs, California, USA.

* cited by examiner

LOGIC GATE CELL STRUCTURE

FIELD OF THE DISCLOSURE

Embodiments of the present disclosure generally relate to integrated circuits that include logic gate cells and, more particularly, to integrated device layer structures that include logic device circuitry.

BACKGROUND

Field-effect transistors (FETs) such as pseudomorphic high electron mobility transistors (pHEMTs) fabricated from a bipolar FET (BiFET) process are often used as loads for heterojunction bipolar transistors in logic circuits. However, typical design rules used for fabricating such logic circuits result in wasted integrated circuit real estate when applied to radio frequency (RF) applications. One reason for this waste is that design rules are most often governed by layouts for RF devices and RF circuitry and not by logic circuitry and/or logic devices. Moreover, external circuit terminals used by both the RF circuitry and the logic circuitry require a further increase in the real estate required to implement both the RF circuitry and the logic circuitry. Thus, there is a need for compact logic gate device layer structures for BJT-FET processes.

SUMMARY

A logic gate cell structure is disclosed. The logic gate cell structure includes a substrate, a channel layer disposed over the substrate, and a field-effect transistor (FET) contact layer disposed over the channel layer. The FET contact layer is divided by an isolation region into a single contact region and a combined contact region. The channel layer and the FET contact layer form part of a FET device. A collector layer is disposed within the combined contact region over the FET contact layer to provide a current path between the channel layer and the collector layer though the FET contact layer. The collector layer, the base layer, and the emitter layer form part of a bipolar transistor.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
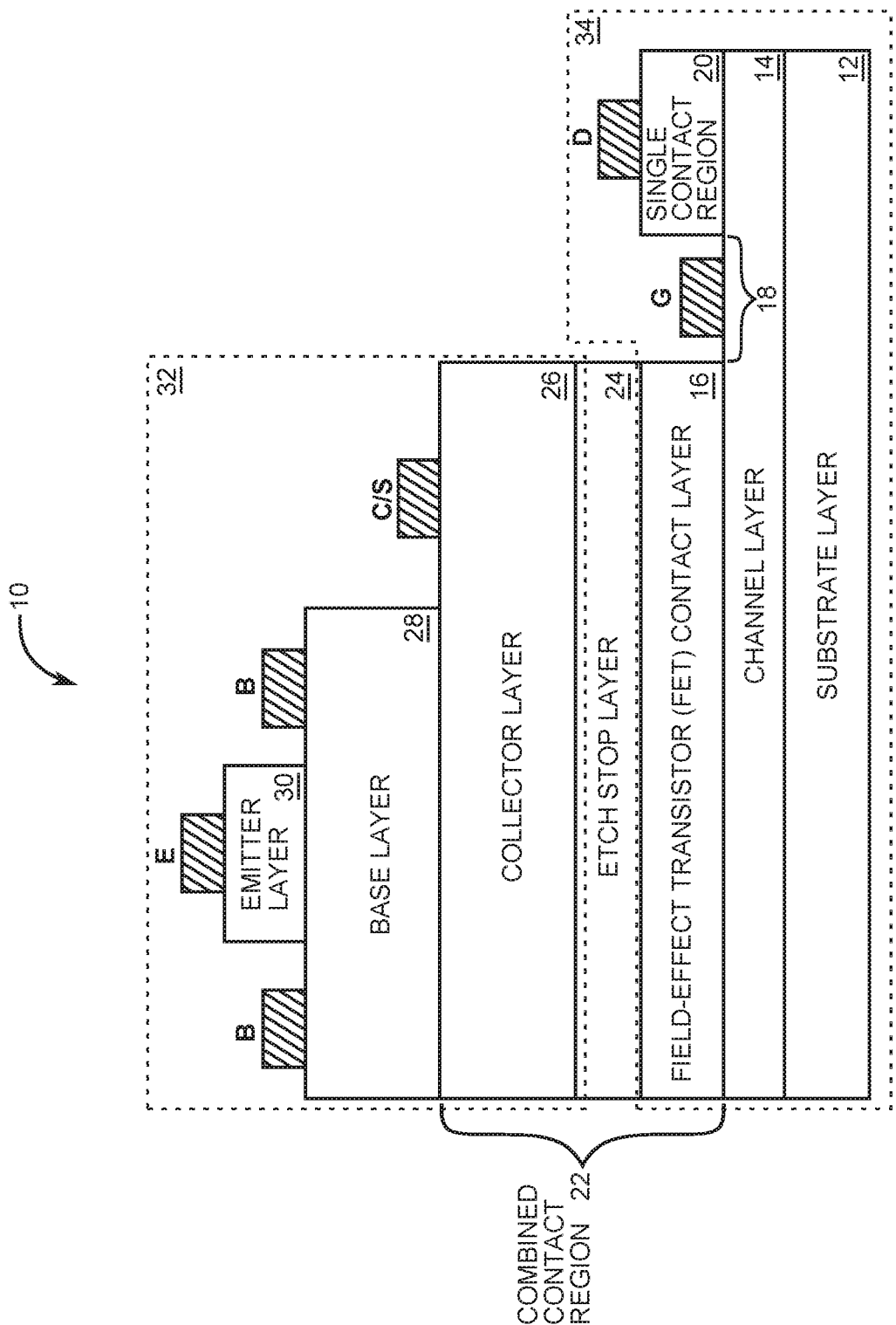
FIG. 1 is a cross-sectional view of an exemplary embodiment of a logic gate cell in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a cross-sectional view of an exemplary embodiment of a logic gate cell 10 in accordance with the present disclosure. The logic gate cell 10 has a substrate 12 that in at least some embodiments is semi-insulating. Gallium arsenide (GaAs) makes up the substrate 12 in some embodiments. A channel layer 14 is disposed over the substrate 12. The channel layer 14 is made of doped GaAs in exemplary embodiments. A field-effect transistor (FET) contact layer 16 is disposed over the channel layer 14. The FET contact layer 16 is divided by an isolation region 18 into a single contact region 20 and a combined contact region 22. The FET contact layer has a thickness that is in the range of 800 angstroms (Å) to 1000 Å

An etch stop layer 24 is typically disposed over the FET contact layer 16 during a fabrication process. The etch stop layer 24 prevents damage to the channel layer 14 during the fabrication process. While an etch stop layer is not strictly required, the etch stop layer 24 eases manufacturing constraints. However, a typical etch stop layer is not desirable because a typical etch stop layer has a resistivity that is too great to realize a logic function presently provided by the logic gate cell 10.

In order to improve conductivity, the etch stop layer 24 has a dopant atom concentration that is in the range of $4 \times 10^{18}$ cm$^{-3}$ to $5 \times 10^{18}$ cm$^{-3}$. Exemplary materials for making up the etch stop layer 24 are aluminum gallium arsenide (AlGaAs) and aluminum arsenide (AlAs). In some embodiments, the thickness of the etch stop layer 24 made of AlGaAs or AlAs that is in the range of 50 Å to 100 Å. In other embodiments, the thickness of the etch stop layer 24 made of AlGaAs or AlAs is in the range of 100 Å to 250 Å. In yet other embodiments, the thickness of the etch stop layer made of AlGaAs or AlAs is in the range of 250 Å to 500 Å.

Other exemplary materials for making up the etch stop layer 24 are indium gallium phosphide (InGaP) and indium phosphide (InP). In some embodiments, the thickness of the etch stop layer 24 made of InGaP or InP is in the range of 12 Å to 100 Å. In other embodiments, the thickness of the etch stop layer 24 made of InGaP or InP is in the range of 100 Å to 250 Å. In yet other embodiments, the thickness of the etch stop layer 24 made of InGaP or InP is in the range of 250 Å to 500 Å. It is to be understood that other materials made from group III-V elements are usable as the etch stop layer 24. The dopant atom concentrations and layer thicknesses for such other materials are selected to yield electrical conductance levels with ranges that are at least equal to the electrical conductance levels yielded by the dopant atom concentrations and layer thicknesses given previously for AlGaAs, AlAs, InGaP, and InP.

A collector layer 26 is disposed within the combined contact region 22 over the FET contact layer 16 to provide a current path between the channel layer 14 and the collector layer 26 through the FET contact layer 16. The etch stop layer 24 has the same type of doping, either negative (n-type) or positive type (p-type) doping, as the collector layer 26. In an exemplary embodiment, the collector layer 26 is made of n-type GaAs with a layer thickness that is in the range of 10,000 Å to 11,000 Å. However, it is to be understood that the layer thickness of the collector layer 26 is within typical ranges commensurate with bipolar junction transistor (BJT) technology.

A base layer 28 is disposed over the collector layer 26, and an emitter layer 30 is disposed over the base layer 28. The collector layer 26, the base layer 28, and the emitter layer 30 make up a bipolar junction transistor (BJT) 32. The materials and layer thicknesses of the base layer 28 and the emitter layer 30 are commensurate with the materials and layer thicknesses for base and emitter layers commonly used to fabricate typical BJT devices. In at least some embodiments, the BJT is of the heterojunction type.

The FET contact layer 16 and the channel layer 14 make up a FET device 34. The FET in at least one exemplary embodiment is a high electron mobility transistor (HEMT). In some embodiments, the FET 34 is of the pseudomorphic HEMT (pHEMT) type. The combined structures of the BJT 32 and the FET 34 realize an overall compact structure for the logic gate cell 10 as a result of sharing the combined contact region 22. An emitter contact E is disposed over the emitter layer 30, and base contacts B are disposed over the base layer 28. As depicted in FIG. 1, a combined collector/source contact C/S is disposed over the collector layer 26 and a drain contact D is disposed over the single contact region 20. However, it is to be understood that a combined collector/drain contact can be disposed over the collector layer 26 and a source contact can be disposed over the single contact region 20 in accordance with the present disclosure. A gate contact G is disposed within the isolation region 18 over the channel layer 14.

Figure 2:
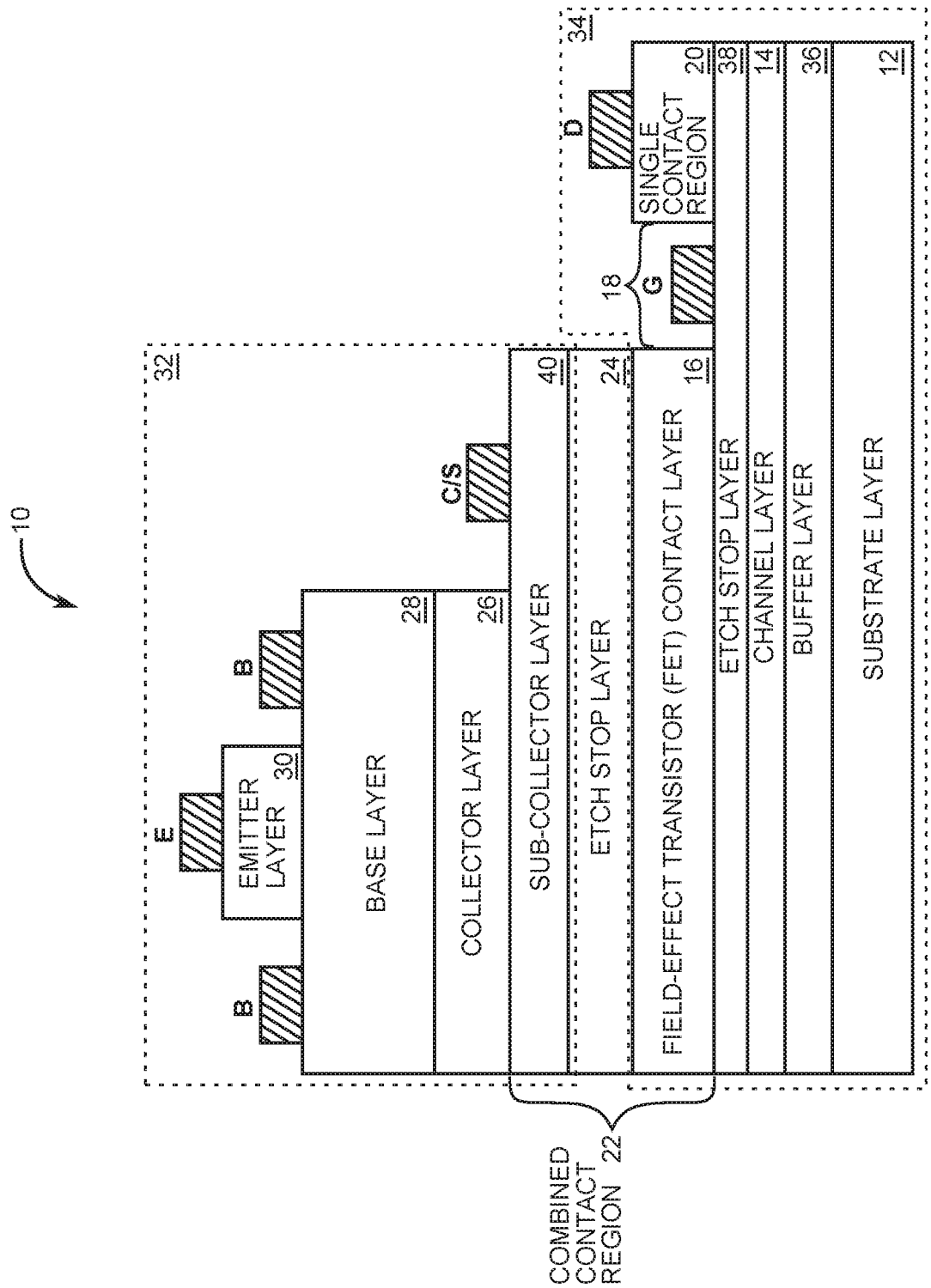
FIG. 2 is a cross-sectional view of another exemplary embodiment of the logic gate cell in accordance with the present disclosure.

FIG. 2 is a cross-sectional view of another exemplary embodiment of the logic gate cell 10 in accordance with the present disclosure. In this particular embodiment, the logic gate cell 10 further includes a buffer layer 36 disposed over the substrate layer 12 between the channel layer 14 and the substrate layer 12. In some embodiments, the buffer layer 36 provides strain relief between the substrate layer 12 and the channel layer 14. The embodiment of FIG. 2 also includes another etch stop layer 38 that is disposed between the channel layer 14 and the FET contact layer 16. Etch stop layer 38 has the same material requirements, dopant atom concentration range, and thickness ranges as the etch stop layer 24.

The embodiment of FIG. 2 further includes a sub-collector layer 40 that is an active layer that functions as a contact layer for the combined collector/source contact C/S. As such, the combined contact region 22 is made up of a portion of the FET contact layer 16 under the collector layer 26, the etch stop layer 24, and the sub-collector 40. It is to be understood that some embodiments of the logic gate cell 10 can include other layers within the combined contact region 22 as long as the resistivity between the collector layer 26 and the channel layer 14 is in the range of 0.1Ω to 1000Ω. In other embodiments, resistivity between the collector layer 26 and the channel layer 14 is in the range of 0.1Ω to 100Ω. In yet other embodiments, resistivity between the collector layer 26 and the channel layer 14 is in the range of 0.1Ω to 1000Ω. In still other embodiments, resistivity between the collector layer 26 and the channel layer 14 is in the range of 500Ω to 1000Ω.

Figure 3:
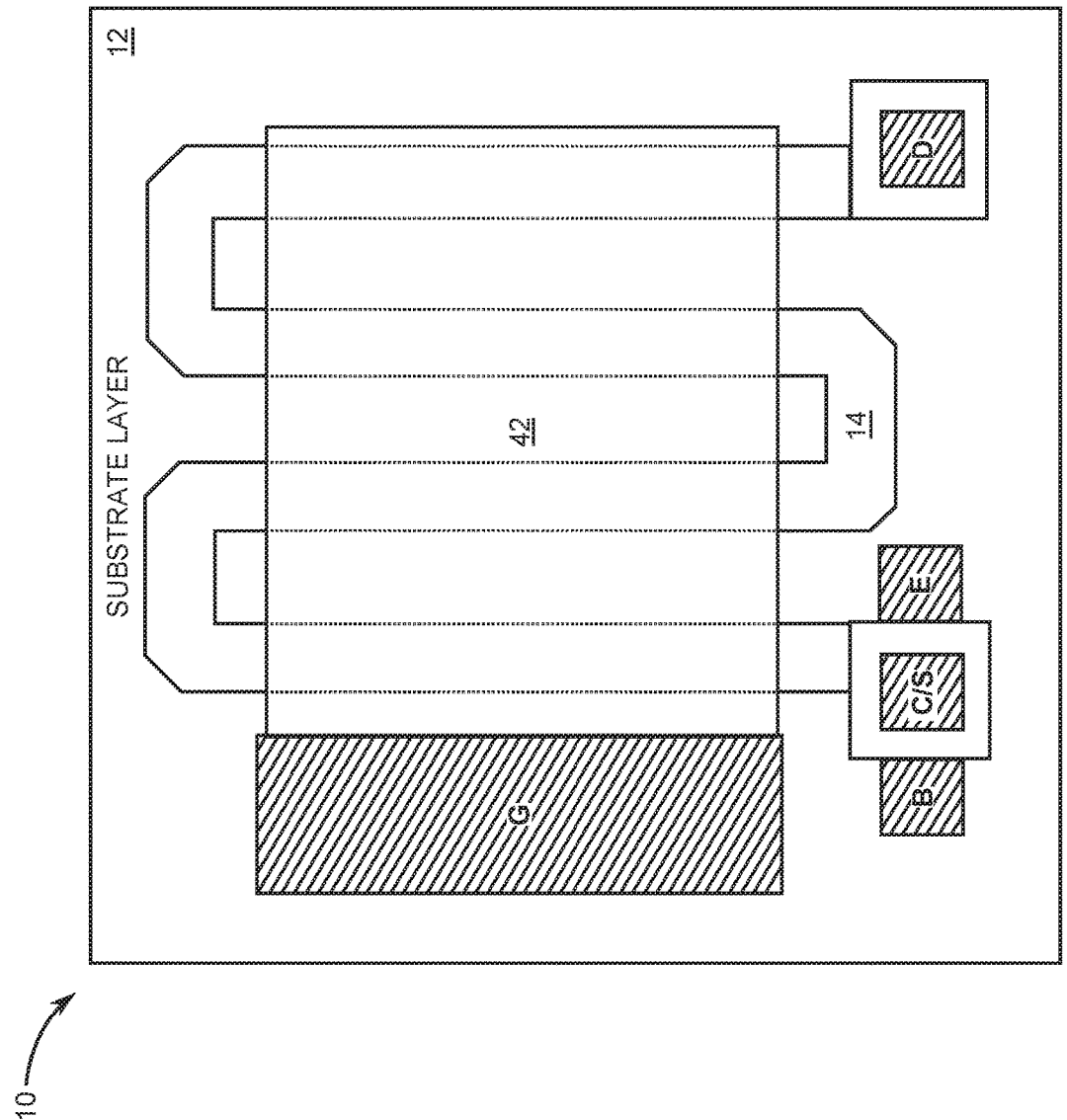
FIG. 3 is a partial layout view of an exemplary embodiment of the logic gate cell.

FIG. 3 is a partial layout view of an exemplary embodiment of the logic gate cell 10. A gate dielectric layer 42 is disposed over the channel layer 14, which in this exemplary embodiment is depicted as having four stripes. It is to be understood that the channel layer can have a finite practical number of stripes including a single stripe.

Figure 4:
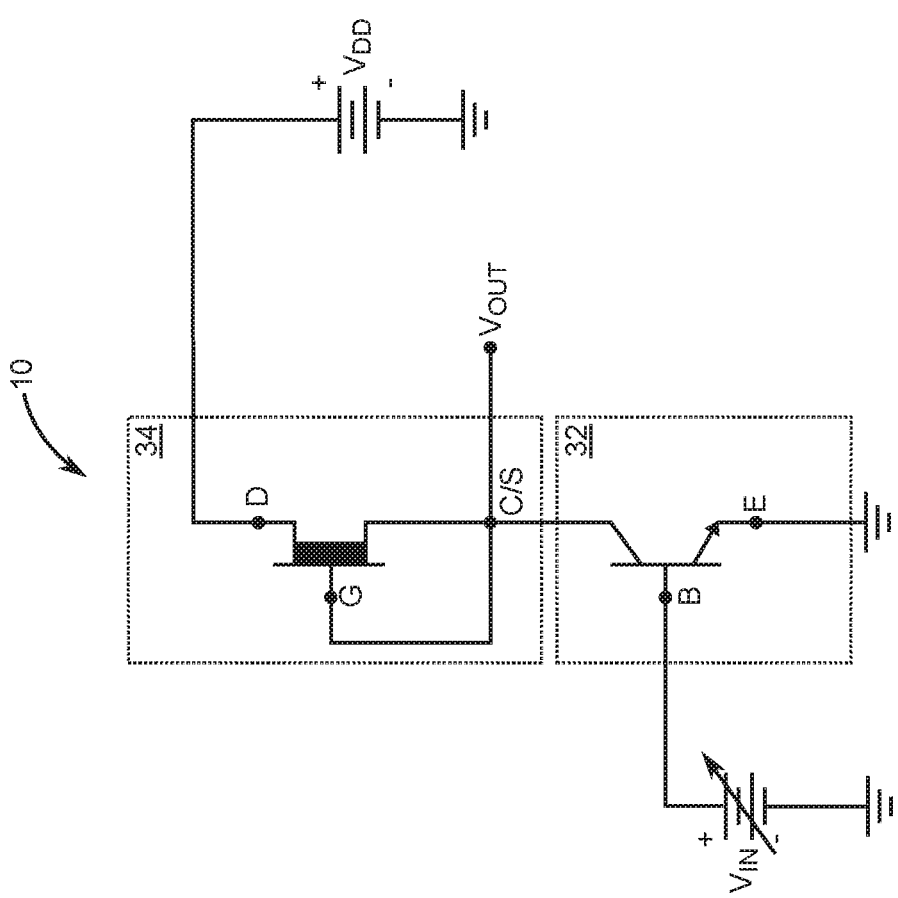
FIG. 4 is a schematic diagram of the logic gate cell in a test configuration.

FIG. 4 is a schematic diagram of the logic gate cell 10 in a test configuration. In this exemplary embodiment, the FET device 34 is a depletion-type FET. However, in other embodiments of the logic gate cell 10, the FET device 34 is an enhancement-mode type. In the particular test configuration depicted in FIG. 4, a supply voltage $V_{DD}$ is set to 3.5 V. A variable input voltage $V_{IN}$ applied to the base of the BJT 32 is sweep from 0 V to 1.5 V. A logic level output voltage $V_{OUT}$ is measured at the combined collector/source contact C/S. The variable input voltage $V_{IN}$, the logic level output voltage $V_{OUT}$, and the supply voltage $V_{DD}$ are measured with respect to ground.

Figure 5:
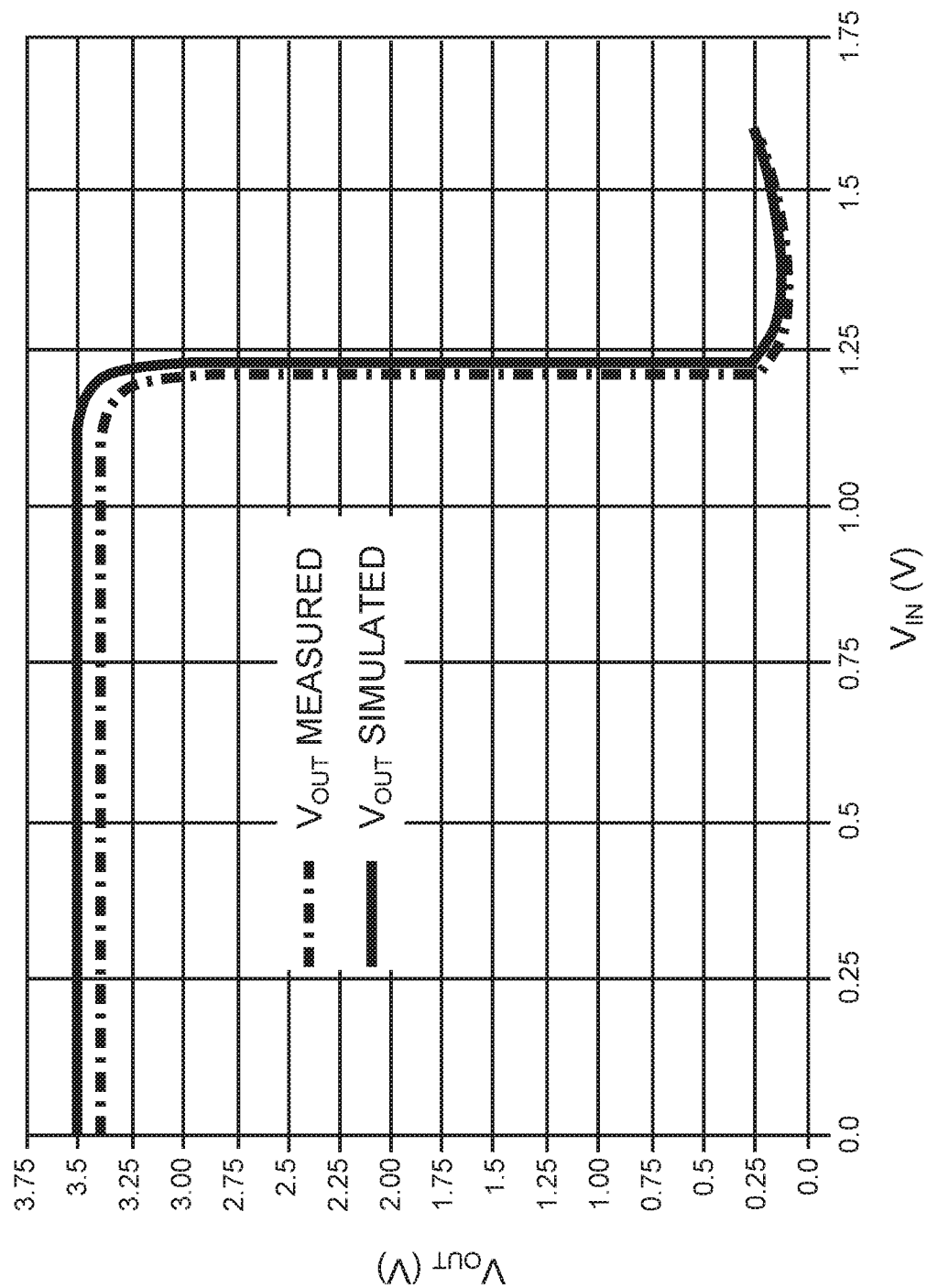
FIG. 5 is a graph of input voltage versus output voltage for the logic gate cell configured in the test configuration of FIG. 4.

FIG. 5 is a graph of variable input voltage $V_{IN}$ versus logic level output voltage $V_{OUT}$ for the logic gate cell 10 configured in the test configuration of FIG. 4. In particular, the graph of FIG. 5 depicts a measured $V_{OUT}$ shown in solid line versus simulated $V_{OUT}$ shown in dot-and-dashed line.

Those skilled in the art will recognize improvements and modifications to the preferred embodiments of the present disclosure. All such improvements and modifications are considered within the scope of the concepts disclosed herein and the claims that follow.

What is claimed is:

1. A logic gate cell structure comprising:
a substrate;
a channel layer disposed over the substrate;
a field-effect transistor (FET) contact layer disposed over the channel layer and divided by an isolation region into a first portion within a single contact region and a second portion within a combined contact region, wherein a gate contact is disposed within the isolation region over the channel layer, and the channel layer and the FET contact layer form part of a FET device;
a first etch stop layer disposed over the second portion of the FET contact layer within the combined contact region, wherein the first etch stop layer has a dopant atom concentration that is in the range from $4\times10^{18}$ cm$^{-3}$ to $5\times10^{18}$ cm$^{-3}$;
a sub-collector layer disposed within the combined contact region and directly onto the first etch stop layer to provide a shorted current path between the gate contact and a combined collector/source contact disposed over the sub-collector layer;
a collector layer disposed over the sub-collector layer, wherein the collector layer has the same type of doping as the first etch stop layer;
a base layer disposed over the collector layer; and
an emitter layer disposed over the base layer, wherein the sub-collector, the collector layer, the base layer, and the emitter layer form part of a bipolar junction transistor.

2. The logic gate cell structure of claim 1 further comprising a second etch stop layer disposed between the FET contact layer and the channel layer.

3. The logic gate cell structure of claim 2 wherein the second etch stop layer has a dopant atom concentration that is in the range of $4\times10^{18}$ cm$^{-3}$ to $5\times10^{18}$ cm$^{-3}$.

4. The logic gate cell structure of claim 2 wherein the first etch stop layer and the second etch stop layer are made of aluminum gallium arsenide.

5. The logic gate cell structure of claim 2 wherein the first etch stop layer and the second etch stop layer are made of aluminum arsenide.

6. The logic gate cell structure of claim 2 wherein the first etch stop layer and the second etch stop layer are made of indium gallium phosphide.

7. The logic gate cell structure of claim 2 wherein the first etch stop layer and the second etch stop layer are made of indium phosphide.

8. The logic gate cell structure of claim 2 wherein the first etch stop layer has a thickness that is in the range of 12 angstroms (Å) to 100 Å.

9. The logic gate cell structure of claim 2 wherein the second etch stop layer has a thickness that is in the range of 12 Å to 100 Å.

10. The logic gate cell structure of claim 2 wherein the first etch stop layer has a thickness that is in the range of 100 Å to 250 Å.

11. The logic gate cell structure of claim 2 wherein the second etch stop layer has a thickness that is in the range of 100 Å to 250 Å.

12. The logic gate cell structure of claim 2 wherein the first etch stop layer has a thickness that is in the range of 250 Å to 500 Å.

13. The logic gate cell structure of claim 2 wherein the second etch stop layer has a thickness that is in the range of 250 Å to 500 Å.

14. The logic gate cell structure of claim 1 wherein electrical resistivity between the collector layer and the channel layer is in the range of 0.1Ω to 1000Ω.

15. The logic gate cell structure of claim 1 wherein electrical resistivity between the collector layer and the channel layer is in the range of 0.1Ω to 100Ω.

16. The logic gate cell structure of claim 1 wherein electrical resistivity between the collector layer and the channel layer is in the range of 100Ω to 500Ω.

17. The logic gate cell structure of claim 1 wherein electrical resistivity between the collector layer and the channel layer is in the range of 500Ω to 1000Ω.

18. The logic gate cell structure of claim 1 wherein the sub-collector layer extends beyond the collector layer to include an exposed surface onto which a combined collector/source contact is disposed.

19. The logic gate cell structure of claim 1 further including a gate contact disposed within the isolation region over the channel layer, an emitter contact disposed over the emitter layer, and a base contact disposed over the base layer.

20. The logic gate cell structure of claim 2 further including a buffer layer.

21. The logic gate cell structure of claim 1 wherein the FET device is a high electron mobility transistor (HEMT).

22. A logic gate cell structure comprising:
a substrate;
a channel layer disposed over the substrate;
a first etch stop layer disposed over the channel layer;
a FET contact layer disposed over the channel layer and divided by an isolation region into a first portion within a single contact region and a second portion within a combined contact region, wherein a gate contact is disposed within the isolation region over the channel layer, and the channel layer and the FET contact layer form part of a FET device;
a second etch stop layer disposed over the second portion within the FET contact layer;
a sub-collector layer disposed within the combined contact region and directly onto the first etch stop layer to provide a shorted current path between the gate contact and a combined collector/source contact disposed over the sub-collector layer;
a collector layer disposed over the sub-collector layer, wherein the collector layer has the same type of doping as the first etch stop layer;
a base layer disposed over the collector layer; and
an emitter layer disposed over the base layer, wherein the sub-collector layer, the collector layer, the base layer, and the emitter layer form part of a bipolar junction transistor.

* * * * *